US009081400B2

(12) United States Patent
Pang

(10) Patent No.: US 9,081,400 B2
(45) Date of Patent: Jul. 14, 2015

(54) APPARATUS AND METHOD FOR OUTPUTTING SIGNAL

(71) Applicant: Samsung Electro-Mechanics Co., Ltd., Suwon, Gyunggi-do (KR)

(72) Inventor: Sung Man Pang, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 0 days.

(21) Appl. No.: 13/941,328

(22) Filed: Jul. 12, 2013

(65) Prior Publication Data

US 2014/0070874 A1 Mar. 13, 2014

(30) Foreign Application Priority Data

Sep. 11, 2012 (KR) ........................ 10-2012-0100678

(51) Int. Cl.

| | |
|---|---|
| ***H01L 35/00*** | (2006.01) |
| ***H01L 37/00*** | (2006.01) |
| ***H03K 3/42*** | (2006.01) |
| ***H03K 17/78*** | (2006.01) |
| ***G05F 1/10*** | (2006.01) |
| ***G05F 3/24*** | (2006.01) |

(52) U.S. Cl.
CPC . *G05F 1/10* (2013.01); *G05F 3/245* (2013.01)

(58) Field of Classification Search
CPC ......... G01K 7/01; G01K 3/005; G01K 7/015; G05F 3/30; G05F 3/267; G05F 3/262; G05F 3/205; H01L 23/34; H03F 1/302; H03F 2200/447; G11C 5/147
USPC ................... 327/512, 513, 539; 323/313, 315
See application file for complete search history.

(56) References Cited

U.S. PATENT DOCUMENTS

| | | | | |
|---|---|---|---|---|
| 6,157,244 | A * | 12/2000 | Lee et al. | 327/539 |
| 7,307,468 | B1 * | 12/2007 | Vasudevan | 327/539 |
| 2005/0068018 | A1 * | 3/2005 | Ho | 323/315 |
| 2005/0127987 | A1 * | 6/2005 | Sato et al. | 327/539 |
| 2006/0176042 | A1 | 8/2006 | Lin et al. | |
| 2006/0197585 | A1 * | 9/2006 | Kim et al. | 327/539 |
| 2010/0046580 | A1 | 2/2010 | Hasegawa | |
| 2011/0316515 | A1 | 12/2011 | Mitsuda et al. | |

FOREIGN PATENT DOCUMENTS

| | | | |
|---|---|---|---|
| CN | 1831698 | A | 9/2006 |
| CN | 102279617 | A | 12/2011 |
| CN | 102368678 | A | 3/2012 |
| JP | 2010-048628 | A | 3/2010 |

OTHER PUBLICATIONS

Notification of the First Office Action Chinese Patent Application No. 2013103170480 dated Dec. 4, 2014 with English translation.

* cited by examiner

*Primary Examiner* — Quan Tra
(74) *Attorney, Agent, or Firm* — McDermott Will & Emery LLP

(57) ABSTRACT

There is provided an apparatus for outputting a signal, including: a reference signal generating unit outputting a first temperature coefficient signal having a positive temperature coefficient and a second temperature coefficient signal having a negative temperature coefficient; and an output unit outputting an output signal having a plurality of temperature coefficients, based on the first temperature coefficient signal and the second temperature coefficient signal.

9 Claims, 5 Drawing Sheets

APPARATUS AND METHOD FOR OUTPUTTING SIGNAL

CROSS-REFERENCE TO RELATED APPLICATIONS

This application claims the priority of Korean Patent Application No. 10-2012-0100678 filed on Sep. 11, 2012, in the Korean Intellectual Property Office, the disclosure of which is incorporated herein by reference.

BACKGROUND OF THE INVENTION

1. Field of the Invention

The present invention relates to an apparatus and a method for outputting a signal having a plurality of temperature coefficients.

2. Description of the Related Art

In general, in designing circuits and devices, it is essential to ensure stability of temperature, supply voltage, processing variation, and so on, not only for ensuring the performance of the circuits and devices, but also for ensuring yield rates. Particularly, in designing stable circuits and devices, it is very important to ensure the stable operation of a bias circuit, which directly influences the performance of the circuits and devices.

Among other components of circuits and devices, transistors have characteristics that change depending on changes in temperature, and thus a bias circuit for compensating for the changes is required. The most noticeable changes in the characteristics of the transistors depending on changes in temperatures are threshold voltage and mobility. For a MOS transistor, its transconductance is changed if the threshold voltage and mobility are changed. Typically, the transconductance decreases as temperature increases, and thus a bias circuit for compensating for the decreased transconductance is required.

In the related art, as a method for compensating for changes in such temperature-dependent characteristics, there is a known technique of using a band gap reference circuit to generate a stable bias current or voltage. A proportional to absolute temperature (PTAT) circuit included in the band gap reference circuit has a positive temperature coefficient for absolute temperature so that bias current or voltage increases as temperature increases. In addition, a complementary to absolute temperature (CTAT) circuit included in the band gap reference circuit has a negative temperature coefficient for absolute temperature so that bias current or voltage decreases as temperature increases. By applying those positive and negative temperature coefficient circuits, temperature compensation may be achieved to a limited extent.

However, those positive and negative temperature coefficient circuits applied in the band gap reference circuit according to the related art have invariable, i.e., positive or negative temperature coefficients, they have limits to be applied to a circuit having various temperature-dependent characteristics.

That is, since circuit and devices also include passive elements such as resistors, in addition to MOS transistors, a temperature compensating circuit having variable temperature coefficients is required for compensating for minute changes in temperature-dependent characteristics of such passive elements. Moreover, since different circuit have different temperature coefficients of a bias circuit necessary for temperature compensation, an apparatus for outputting a signal having various temperature coefficients is required.

RELATED ART DOCUMENT (Patent Document 1) Japanese Patent Laid-open Publication No. 2010-048628

SUMMARY OF THE INVENTION

An aspect of the present invention provides an apparatus and a method for outputting a signal having a plurality of temperature coefficients.

According to an aspect of the present invention, there is provided an apparatus for outputting a signal, including: a reference signal generating unit outputting a first temperature coefficient signal having a positive temperature coefficient and a second temperature coefficient signal having a negative temperature coefficient; and an output unit outputting an output signal having a plurality of temperature coefficients, based on the first temperature coefficient signal and the second temperature coefficient signal.

The output unit may include: a first reference signal adjusting unit adjusting a gradient of the first temperature coefficient signal, and a second reference signal adjusting unit adjusting a gradient of the second temperature coefficient signal.

The output unit may include a PCTAT signal generating unit outputting a third temperature coefficient signal having a positive temperature coefficient and a negative temperature coefficient, based on the first temperature coefficient signal and the second temperature coefficient signal.

The PCTAT signal generating unit may compare the first temperature coefficient signal with the second temperature coefficient, and output the smaller.

The PCTAT signal generating unit may include: a bias voltage receiving unit to which a bias voltage is applied by the first temperature coefficient signal and the second temperature coefficient signal; a current mirror unit for the bias voltage receiving unit; and a PCTAT signal output unit outputting a third temperature coefficient signal through the current mirror unit.

The bias voltage receiving unit may include a first MOSFET having a source terminal thereof connected to a supply voltage, and a seventh MOSFET connected to a drain of the third MOSFET; and the current mirror unit may include a fourth MOSFET having a source terminal thereof connected to the source terminal of the supply voltage, and an eighth MOSFET connected to a drain of the fourth MOSFET; and the PCTAT signal output unit is formed in at least one of the drain of the fourth MOSFET and the drain of the eighth MOSFET.

The PCTAT signal generating unit may include: first to fourth MOSFETs having their sources connected to a supply voltage; fifth to eighth MOSFETs respectively connected to the drain terminals of the first to fourth MOSFETs; a first current source connected to a drain terminal of the fifth MOSFET and outputting a current having a positive temperature coefficient; a first resistor connected to a drain of the sixth MOSFET; a second current source connected to a drain terminal of the seventh MOSFET and outputting a current having a negative temperature coefficient; and a second resistor connected to a drain terminal of the eighth MOSFET, wherein the gate terminals of the first and second MOSFETs are connected to the drain of the first MOSFET, the gate terminals of the third and fourth MOSFETs are connected to the drain of the third MOSFET, and the gate terminals of the fifth to eighth MOSFETs are connected to the drain of the fifth MOSFET.

The output unit may include a signal synthesizing unit acquiring an output signal having a plurality of temperature coefficients based on at least one of the first to third temperature coefficients.

The signal synthesizing unit may include: a first input terminal receiving at least one of the first to third temperature coefficients; a second input terminal receiving at least one of the first to third temperature coefficients; and an amplifier having its positive input terminal connected to the first input terminal and its negative input terminal connected to the second input terminal via a buffer element and a third resistor, wherein an output terminal of the amplifier is connected to the negative input terminal of the amplifier via a fourth resistor.

According to another aspect of the present invention, there is provided a method for outputting a signal, including: outputting a first temperature coefficient signal having a positive temperature coefficient and a second temperature coefficient signal having a negative temperature coefficient; and outputting an output signal having a plurality of temperature coefficients, based on the first temperature coefficient signal and the second temperature coefficient signal.

The outputting of the output signal may include: adjusting a gradient of the first temperature coefficient signal, and adjusting a gradient of the second temperature coefficient signal.

The outputting of the output signal may include outputting a third temperature coefficient signal having a positive temperature coefficient and a negative temperature coefficient, based on the first temperature coefficient signal and the second temperature coefficient signal.

The outputting of the output signal may include acquiring a signal having a plurality of temperature coefficients based on at least one of the first to third temperature coefficients.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
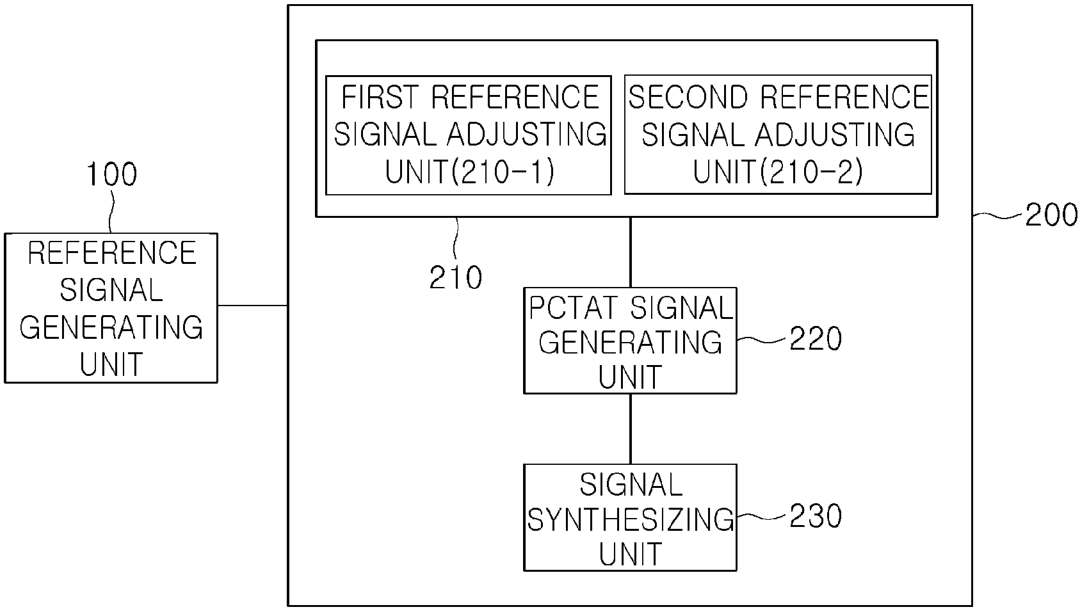
FIG. 1 is a block diagram of an apparatus for outputting a signal according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. Throughout the drawings, the same or like reference numerals will be used to designate the same or like elements.

FIG. 1 is a block diagram of an apparatus for outputting a signal according to an embodiment of the present invention.

The apparatus may include a reference signal generating unit 100 and an output unit 200 for outputting an output signal.

The reference signal generating unit 100 may output a signal having a positive temperature coefficient and a negative temperature coefficient.

Hereinafter, the signal having a positive temperature coefficient is defined as a first temperature coefficient signal, and the signal having a negative temperature coefficient is defined as a second temperature coefficient signal.

The first and second temperature coefficient signals may be a current or voltage value.

As the reference signal generating unit 100, a typical band gap reference circuit may be used.

Figure 2:
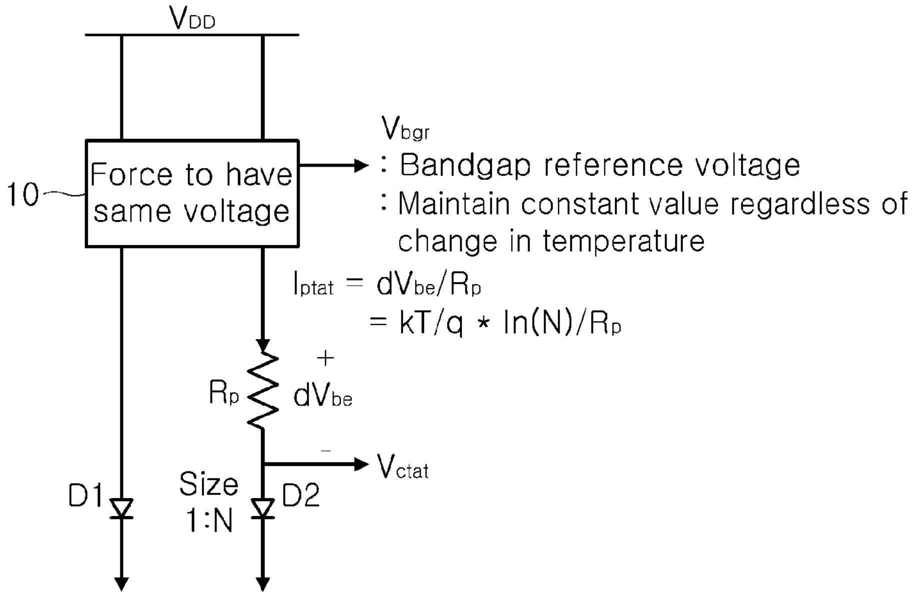
FIG. 2 is a circuit diagram of an example of a band gap reference circuit.

FIG. 2 is a circuit diagram of an example of a band gap reference circuit.

The band gap reference circuit may include a band gap reference voltage forcing unit 10 connected to supply voltage VDD. The band gap reference voltage forcing unit 10 may force a constant reference voltage value regardless of changes in temperature.

Between one terminal of the band gap reference voltage forcing unit 10 and the ground voltage, a first diode D1 may be provided.

Further, a resistor $R_p$ may be connected to the other terminal of the band gap reference voltage forcing unit 10. In addition, a second diode D2 may be connected to one terminal of the resistor $R_p$.

Here, if the ratio of the first diode D1 and the second diode D2 is 1:N, the PTAT current $I_{ptat}$ may be represented as $$I_{ptat} = dV_{be} / R_p = \frac{kT}{q} \times \frac{\ln(N)}{R_p}.$$

Wherein k denotes a Boltzmann constant, T denotes an absolute temperature, and q denotes an electron charge amount. Here, $dV_{be}$ is a voltage across the resistor $R_p$.

Accordingly, the PTAT current $I_{ptat}$ may be increased in proportion to the absolute temperature T.

The voltage $V_{ctat}$ on the connection terminal between the resistor $R_p$ and the second diode D2 is inversely proportional to the absolute temperature T. The voltage on the connection terminal between the resistor $R_p$ and the second diode D2 may be CTAT voltage.

The band gap reference circuit is not limited to that described above, and any band gap reference circuit commonly used by those skilled in the art may be employed.

Further, converting the PTAT current $I_{ptat}$ into the PTAT voltage, and converting the CTAT voltage $V_{ctat}$ into the CTAT current are easily conceivable to those skilled in the art.

Accordingly, the band gap reference circuit may output the PTAT current, the PTAT voltage, the CTAT current and the CTAT voltage.

Hereinafter, the PTAT current and the PTAT voltage may be collectively referred to as a PTAT signal or the first temperature coefficient signal. Further, the CTAT current and the CTAT voltage may be collectively referred to as a CTAT signal or the second temperature coefficient signal.

Figure 3A:
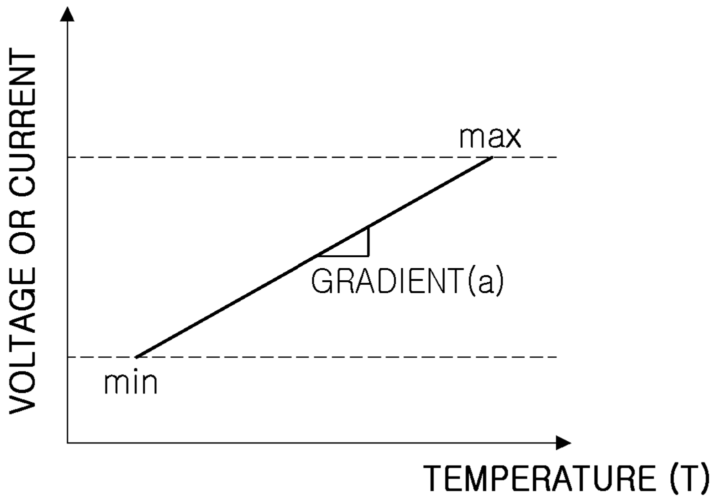
FIGS. 3A and 3B are graphs showing a first temperature coefficient signal and a second temperature coefficient signal, respectively.
Figure 3B:
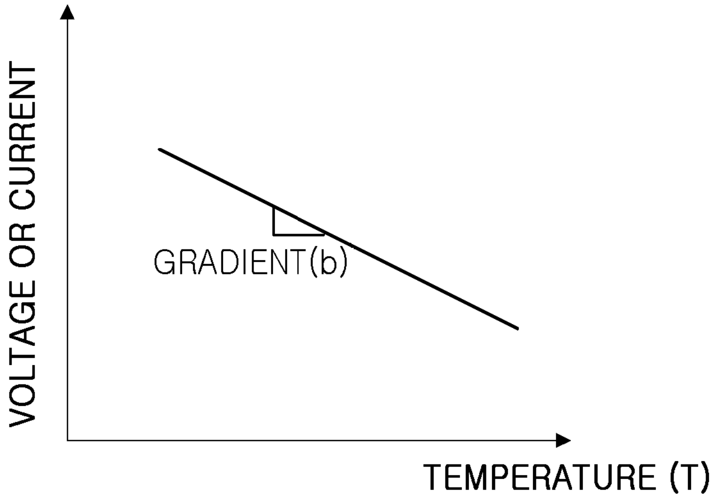

FIGS. 3A and 3B are graphs showing the first temperature coefficient signal and the second temperature coefficient signal, respectively.

FIG. 3A is a graph showing the proportional to absolute temperature (PTAT) current (voltage). FIG. 3B is a graph showing the complementary to absolute temperature (CTAT) current (voltage).

Referring to FIG. 3A, gradient (a) of the first temperature coefficient signal has a positive value. Referring to FIG. 3B, gradient (b) of the second temperature coefficient signal has a negative value.

A representative CTAT voltage is a signal having a temperature coefficient of 1.6 mv/deg. The temperature coefficient may be increased as the value is amplified.

In a system having an output linear with respect to temperature, detection errors may be reduced with larger temperature coefficient, and thus it is preferable to set the temperature to a larger value.

However, using an amplifier for increasing the temperature coefficients (gradients a and b) results in increasing the minimum and maximum values. Accordingly, the acceptance range of the circuit for receiving the amplified signal also needs be increased.

Alternately, in a circuit having a preset acceptance range of an input signal, there is a limitation that a signal should be amplified within the preset range.

Accordingly, it is desirable that the gradients of the temperature coefficients be adjusted appropriately, depending on situations.

Figure 4B:
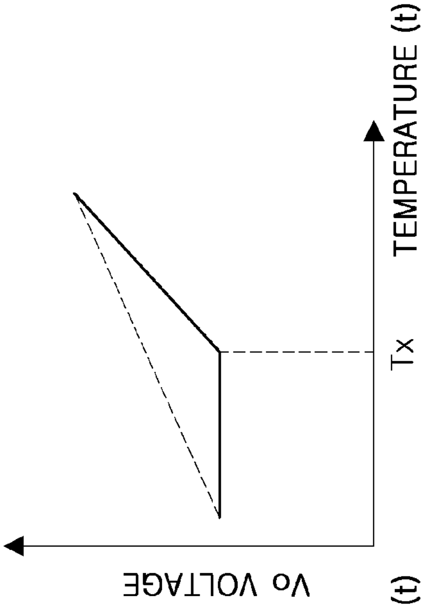
FIGS. 4A to 4C are graphs showing a temperature coefficient signal having a plurality of temperature coefficients.
Figure 4A:
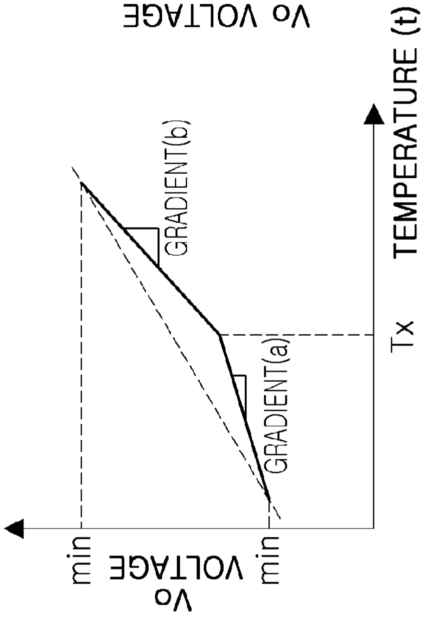
Figure 4C:
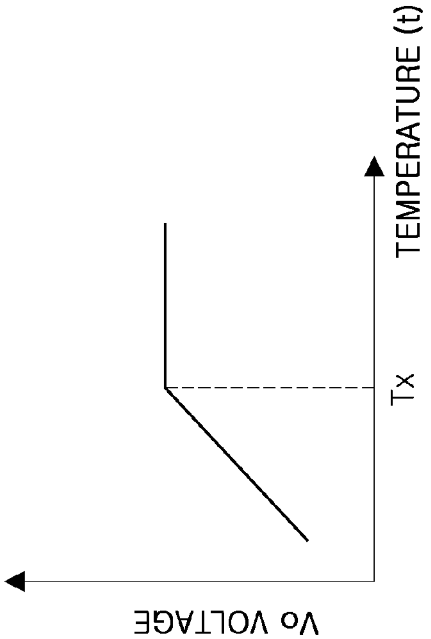

FIGS. 4A to 4C are graphs showing temperature coefficient signals having a plurality of temperature coefficients.

FIG. 4A is a graph showing a temperature coefficient signal having a predetermined gradient (a) below an inflection point temperature $T_x$ and having a predetermined gradient (b) different from gradient (a) above the inflection point temperature $T_x$.

When the minimum and maximum values of the temperature coefficient signal are set, a signal having a gradient within the range (represented by the dotted line in FIG. 4A) may be created. Alternatively, a signal having a plurality of gradients (represented by the solid line in FIG. 4A) may be created within the range.

Here, the signal having a plurality of gradients may represent an accurate output value regardless of changes in temperature since the gradient of the signal is further increased above the inflection point temperature $T_x$. That is, when a precise output value within a predetermined temperature range is required, a signal having a plurality of temperature coefficients may be used.

FIG. 4B is a graph showing a temperature coefficient signal having the gradient of 0, below an inflection point temperature $T_x$, and having a positive gradient above the inflection point temperature $T_x$.

If the temperature coefficient signal is only utilized above a certain inflection temperature, the temperature coefficient signal illustrated in FIG. 4B may be utilized.

FIG. 4C is a graph showing a temperature coefficient signal having a positive gradient below an inflection point temperature $T_x$ and having the gradient of 0 above the inflection point temperature $T_x$.

If the temperature coefficient signal is only utilized blow a certain inflection temperature, the temperature coefficient signal illustrated in FIG. 4C may be utilized.

Although FIGS. 4A to 4C have been described with the case in which the output value is in voltage form $V_0$, the same principle may be applied to the case in which the output value is in current form.

The output unit 200 may output an output signal having a plurality of temperature coefficients based on the first temperature coefficient signal and the second temperature coefficient signal output from the reference signal generating unit 100.

Referring back to FIG. 1, the output unit 100 may include a reference signal adjusting unit 210, a PCTAT signal generating unit 220, and a signal synthesizing unit 230.

The reference signal adjusting unit 210 may include a first reference signal adjusting unit 210-1 and a second reference signal adjusting unit 210-2.

The first reference signal adjusting unit 210-1 may adjust the gradient of the first temperature coefficient signal.

The second reference signal adjusting unit 210-2 may adjust the gradient of the second temperature coefficient signal.

Figure 5A:
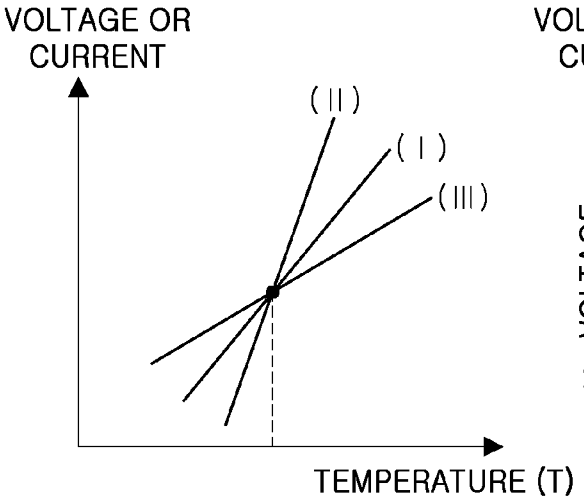
FIGS. 5A and 5B are graphs showing adjusting of the gradients of the temperature coefficient signals.
Figure 5B:
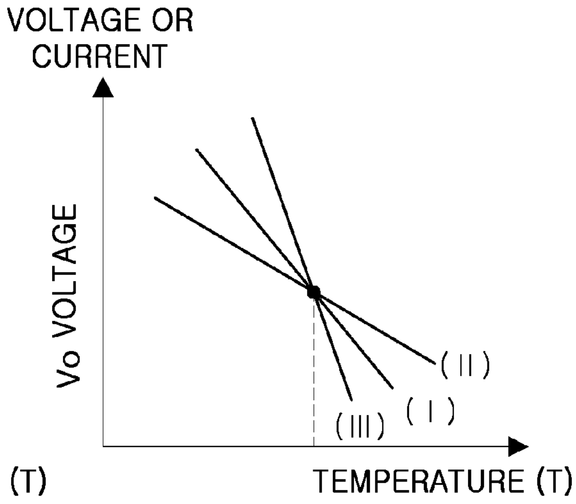

FIGS. 5A and 5B are graphs showing adjusting of the gradients of the temperature coefficient signals.

FIG. 5A shows the changed gradients of the first temperature coefficient signal. For the first temperature coefficient signal having a predetermined temperature coefficient (I), before and after a predetermined temperature $T_1$, the gradient may increase (II) or decrease (III).

FIG. 5B shows the changed gradients of the second temperature coefficient signal. For the second temperature coefficient signal having a predetermined temperature coefficient (I), before and after a predetermined temperature $T_2$, the gradient may increase (II) or decrease (III).

The first and second reference signal adjusting units 210-1 and 210-2 may adjust the gradients of the first and second temperature coefficient signals based on the predetermined temperatures.

Accordingly, the first and second temperature coefficient signals output from the reference signal generating unit 100 may be adjusted appropriately as required by the reference signal adjusting unit 210 so as to be used by the PCTAT signal generating unit 220 or the signal synthesizing unit 230.

The PCTAT signal generating unit 220 may output a temperature coefficient signal having a positive temperature coefficient and a negative temperature coefficient. For example, the PCTAT signal generating unit 220 may output the first temperature coefficient signal below a predetermined temperature and may output the second temperature coefficient signal above the predetermined temperature.

Here, a temperature coefficient signal having a positive temperature coefficient and a negative temperature coefficient may be defined a third temperature coefficient signal or the PCTAT signal.

Figure 6:
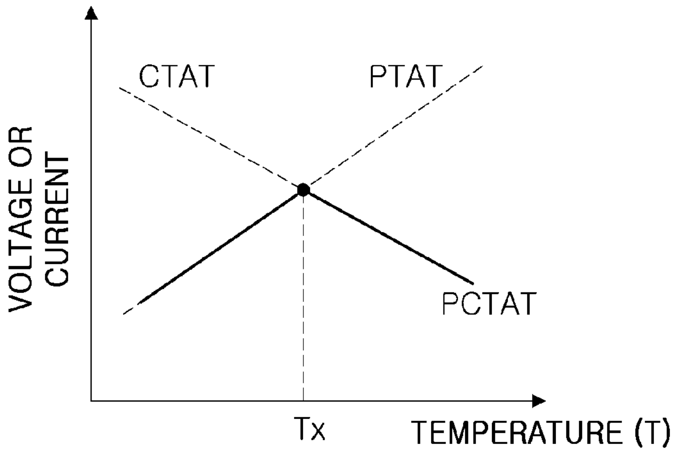
FIG. 6 is a graph showing the operation of a PCTAT signal generating unit.

FIG. 6 is a graph showing the operation of the PCTAT signal generating unit 220.

The PCTAT signal generating unit may acquire a CTAT signal having a negative gradient and a PTAT signal having a positive gradient.

The PCTAT signal generating unit may compare the values of the CTAT signal and the PTAT signal to output the smaller. For example, the third temperature coefficient signal may be output according to the equation $I_{pctat}=\min(I_{ptat}, I_{ctat})$.

The temperature inflection point $T_x$ at which the sign of the gradient is changed may be appropriately adjusted as required.

If the temperature inflection point is $T_x$, $I_{ptat}(T_x)=I_{ctat}(T_x)$ should be met.

Referring to the equation illustrated in FIG. 2, $$\frac{kT_x}{q}\times\ln(N)/R_p = I_{ctat}(T_x)$$

and thus $$T_x = \frac{R_p}{\ln(N)}\times\frac{q}{k}\times I_{ctat}(T_x).$$

Here, $R_p$ denotes the resistance value in FIG. 2, N denotes the ratio of the diodes. Therefore, $T_x$ may be adjusted by appropriately adjusting the resistance value and the ratio of the diodes in FIG. 2.

Figure 7:
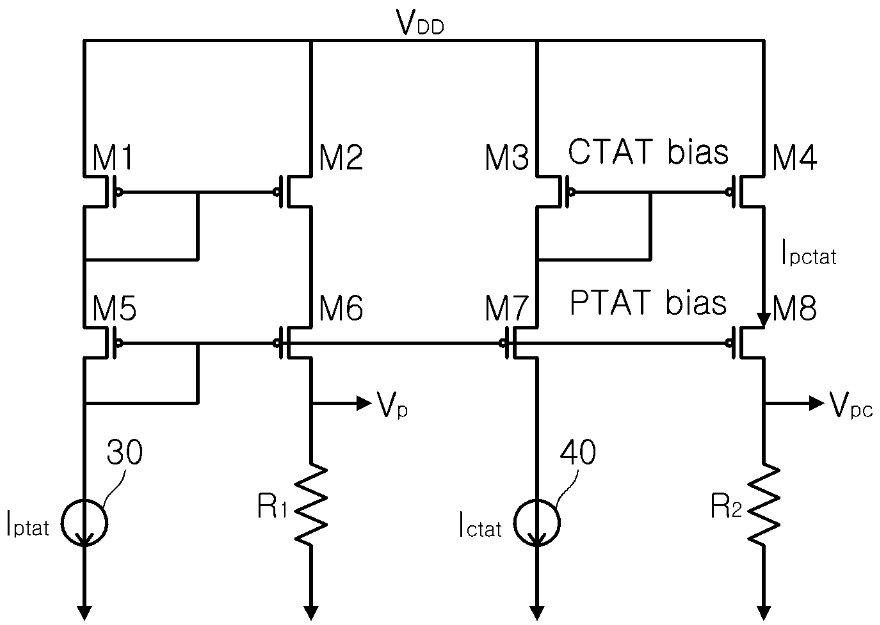
FIG. 7 is a circuit diagram of an example of a PCTAT signal generating circuit.

FIG. 7 is a circuit diagram of an example of a PCTAT signal generating circuit.

Referring to FIG. 7, the PCTAT signal generating circuit may include a first MOSFET (M1), a second MOSFET (M2), a third MOSFET (M3), and a fourth MOSFET (M4), the source terminals of which are connected to a supply voltage. Then, the PCTAT signal generating circuit may include a fifth MOSFET (M5) connected to the drain terminal of the first MOSFET (M1), a sixth MOSFET (M6) connected to the drain terminal of the second MOSFET (M2), a seventh MOSFET (M7) connected to the drain terminal of the third MOSFET (M3), and a eighth MOSFET (M8) connected to the drain terminal of the fourth MOSFET (M4).

The fifth MOSFET (M5) may have a first current source 30 connected to its drain terminal, which outputs a current having a positive temperature coefficient. Current $I_{ptat}$ flows through the first current source 30.

Further, the sixth MOSFET (M6) may have a first resistor R1 connected to its drain terminal.

In addition, the seventh MOSFET (M7) may have a second current source 40 connected to its drain terminal, which outputs a current having a negative temperature coefficient. Current $I_{ctat}$ flows through the second current source 40.

Further, the eighth MOSFET (M8) may have a second resistor R2 connected to its drain terminal.

The gate terminals of the first and second MOSFETs M1 and M2 may be connected to the drain terminal of the first MOSFET M1. Further, the gate terminals of the third and fourth MOSFETs M3 and M4 may be connected to the drain terminal of the third MOSFET M3, and the gate terminals of the fifth, sixth, seventh, and eighth MOSFETs M5, M6, M7 and M8 may be connected to the drain terminal of the fifth MOSFET M5.

The first resistor R1 and the second resistor R2 may have the same temperature characteristics. With the PCTAT signal generating circuit thus configured, a third temperature coefficient signal $I_{pctat}$ may flow in the direction from the fourth MOSFET M4 to the eighth MOSFET M8. Further, a third temperature coefficient signal $V_{pc}$ may be output from the connection terminal between the eighth MOSFET M8 and the second resistor R2.

Further, a first temperature coefficient signal $V_p$ may be output from the connection terminal between the sixth MOSFET M6 and the first resistor R1.

The first and fifth MOSFETs M1 and M5, and the second and sixth MOSFETs M2 and M6 form a current mirror. Accordingly, the current flowing through the first current source 30 flows through the sixth MOSFET M6. Accordingly, the PTAT signal is output as $V_p$.

In addition, a CTAT bias voltage may be applied to the third MOSFET M3, and a PRAT bias voltage may be applied to the seventh MOSFET M7. Here, since the third and seventh MOSFETs M3 and M7 and the fourth and eighth MOSFETs M4 and M8 form the current mirror, the PCTAT current may flow between the fourth MOSFET M4 and the eighth MOSFET M8. Accordingly, the PCTAT signal is output as $V_{pc}$.

Here, since the third MOSFET M3 receives the CTAT bias voltage and the seventh MOSFET M7 receives the PTAT bias voltage, the third MOSFET M3 and the seventh MOSFET M7 are defined as a bias receiving unit.

Further, the fourth MOSFET M4 and the seventh MOSFET M7 are defined as a current mirror unit for the bias receiving unit. Further, the terminal which outputs the PCTAT current and PCTAT voltage is defined as a PCTAT signal output unit.

According to an embodiment of the present invention, the signal synthesizing unit 230 may acquire an output signal having a plurality of temperature coefficients based on the first, second, and third temperature coefficient signals.

For example, the signal synthesizing unit 230 may synthesize the first temperature coefficient signal (III in FIG. 5A, for example) and the third temperature coefficient signal (FIG. 6, for example) having predetermined gradients so as to acquire an output signal the gradient of which rapidly increases until a certain point and then slowly increases after the point.

Further, the signal synthesizing unit 230 may synthesize the first temperature coefficient signal (II in FIG. 5A, for example) and the third temperature coefficient signal (FIG. 6, for example) having a predetermined gradients, to acquire an output signal the gradient of which increases until a certain point and then is maintained after the point.

Figure 8:
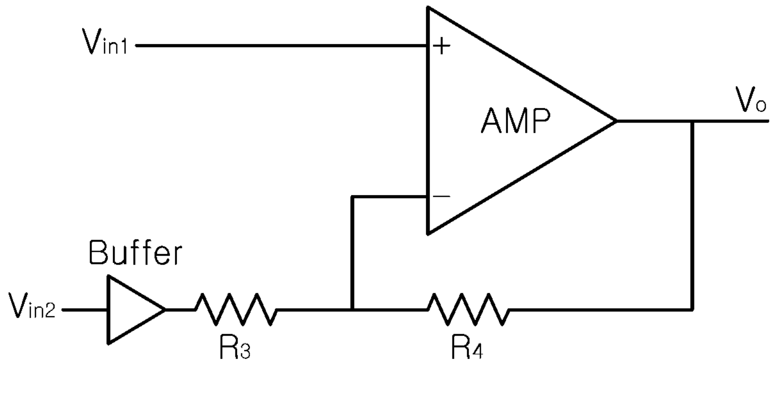
FIG. 8 is a circuit diagram showing an example of a signal synthesizing unit.

FIG. 8 is a circuit diagram showing an example of a signal synthesizing unit.

The signal synthesizing unit may include a first input terminal $V_{in1}$ to receive at least one of the first temperature coefficient signal, the second temperature coefficient signal and the third temperature coefficient signal, and a second input terminal $V_{in2}$ to receive at least one of the first temperature coefficient signal, the second temperature coefficient signal and the third temperature coefficient signal.

The signal synthesizing unit may include an amplifier AMP. The positive (+) input terminal of the amplifier may be connected to the first input terminal $V_{in1}$. Further, the negative input terminal of the amplifier may be connected to the second input terminal $V_{in2}$ via a buffer element and a third resistor R3.

The output terminal Vo of the amplifier may be connected to the negative (−) input terminal of the amplifier via a fourth resistor R4.

The buffer element may be provided in order for the second input not to be influenced by the output signal Vo. Further, the third resistor R3 and the fourth resistor R4 may be of the type having the same temperature characteristic.

Here, the output from the signal synthesizing unit may be represented as below:

$$\begin{aligned} Vo(T) &= \left(1+\frac{R_4}{R_3}\right)\times V_{in1}(T) - \frac{R_4}{R_3}\times V_{in2}(T) \\ &= V_{in1}(T) + \left(\frac{R_4}{R_3}\right)\times(V_{in1}(T) - V_{in2}(T)) \end{aligned}$$

Here, a case in which a signal input to the first input terminal $V_{in1}$ is the PTAT signal illustrated in FIG. 6, and a signal input to the second input terminal $V_{in2}$ is the PCTAT signal illustrated in FIG. 6, is provided as an example, but the present invention is not limited thereto.

Since $V_{in1}(T)=V_{in2}(T)$ below the inflection point temperature $T_x$, $Vo(T)=V_{in1}(T)$.

Above the inflection point temperature $T_x$, an output signal such as $$Vo(T) = V_{in1}(T) + \left(\frac{R_4}{R_3}\right) \times (V_{in1}(T) - V_{in2}(T))$$

may be generated.

That is, the signal synthesizing unit may adjust the gradient of the output signal appropriately above the inflection point temperature $T_x$ by adjusting the values of the third resistor R3 and the fourth resistor R4.

As a result, the output signal according to the embodiment may be the same with that illustrated in FIG. 4A. That is, the gradient becomes greater above the inflection point temperature than below the inflection point temperature.

As such, the signal output device according to the embodiment of the present invention may acquire the third temperature coefficient signal based on the first temperature coefficient signal and the second temperature coefficient signal. Further, the signal output device according to the embodiment of the present invention may generate an output signal having various temperature coefficients based on the first temperature coefficient signal, the second temperature coefficient signal, and the third temperature coefficient signal.

Here, the temperature detection error may be reduced by increasing the temperature coefficients in a temperature region which requires a high degree of precision.

As set forth above, according to embodiments of the present invention, an apparatus and a method for outputting a signal having a plurality of temperature coefficients can be provided.

Further, according to embodiments of the present invention, a temperature detection error can be reduced.

While the present invention has been illustrated and described in connection with the embodiments, it will be apparent to those skilled in the art that modifications and variations can be made without departing from the spirit and scope of the invention as defined by the appended claims.

What is claimed is:

1. An apparatus for outputting a signal, comprising:

a reference signal generating unit outputting a first temperature coefficient signal having a positive temperature coefficient and a second temperature coefficient signal having a negative temperature coefficient; and an output unit outputting an output signal having a plurality of temperature coefficients based on the first temperature coefficient signal and the second temperature coefficient signal, wherein the output unit includes a PCTAT signal generating unit outputting a third temperature coefficient signal having a positive temperature coefficient and a negative temperature coefficient, based on the first temperature coefficient signal and the second temperature coefficient signal, wherein the PCTAT signal generating unit includes:

a bias voltage receiving unit to which a bias voltage is applied by the first temperature coefficient signal and the second temperature coefficient signal;

a current mirror unit for the bias voltage receiving unit; and a PCTAT signal output unit outputting a third temperature coefficient signal through the current mirror unit.

2. The apparatus of claim 1, wherein:

the bias voltage receiving unit includes:

a first MOSFET having a source terminal thereof connected to a supply voltage, and a seventh MOSFET connected to a drain of a third MOSFET; and the current mirror unit includes:

a fourth MOSFET having a source terminal thereof connected to the source terminal of the supply voltage, and an eighth MOSFET connected to a drain of the fourth MOSFET; and wherein the PCTAT signal output unit is formed in at least one of the drain of the fourth MOSFET and the drain of the eighth MOSFET.

3. An apparatus for outputting a signal, comprising:

a reference signal generating unit outputting a first temperature coefficient signal having a positive temperature coefficient and a second temperature coefficient signal having a negative temperature coefficient; and an output unit outputting an output signal having a plurality of temperature coefficients based on the first temperature coefficient signal and the second temperature coefficient signal, wherein the output unit includes a PCTAT signal generating unit outputting a third temperature coefficient signal having a positive temperature coefficient and a negative temperature coefficient, based on the first temperature coefficient signal and the second temperature coefficient signal, wherein the PCTAT signal generating unit compares the first temperature coefficient signal with the second temperature coefficient, and outputs the smaller, wherein the PCTAT signal generating unit includes:

first to fourth MOSFETs having their sources connected to a supply voltage;

fifth to eighth MOSFETs respectively connected to the drain terminals of the first to fourth MOSFETs;

a first current source connected to a drain terminal of the fifth MOSFET and outputting a current having a positive temperature coefficient;

a first resistor connected to a drain of the sixth MOSFET;

a second current source connected to a drain terminal of the seventh MOSFET and outputting a current having a negative temperature coefficient; and a second resistor connected to a drain terminal of the eighth MOSFET, and wherein the gate terminals of the first and second MOSFETs are connected to the drain of the first MOSFET, the gate terminals of the third and fourth MOSFETs are connected to the drain of the third MOSFET, and the gate terminals of the fifth to eighth MOSFETs are connected to the drain of the fifth MOSFET.

4. An apparatus for outputting a signal, comprising:

a reference signal generating unit outputting a first temperature coefficient signal having a positive temperature coefficient and a second temperature coefficient signal having a negative temperature coefficient; and an output unit outputting an output signal having a plurality of temperature coefficients based on the first temperature coefficient signal and the second temperature coefficient signal, wherein the output unit includes a PCTAT signal generating unit outputting a third temperature coefficient signal having a positive temperature coefficient and a negative temperature coefficient, based on the first temperature coefficient signal and the second temperature coefficient signal, wherein the output unit includes a signal synthesizing unit acquiring an output signal having a plurality of temperature coefficients based on at least one of the first to third temperature coefficients, wherein the signal synthesizing unit includes:

a first input terminal receiving at least one of the first to third temperature coefficients;

a second input terminal receiving at least one of the first to third temperature coefficients; and an amplifier having its positive input terminal connected to the first input terminal and its negative input terminal connected to the second input terminal via a buffer element and a third resistor, and wherein an output terminal of the amplifier is connected to the negative input terminal of the amplifier via a fourth resistor.

5. The apparatus of claim 1, wherein the output unit includes: a first reference signal adjusting unit adjusting a gradient of the first temperature coefficient signal, and a second reference signal adjusting unit adjusting a gradient of the second temperature coefficient signal.

6. The apparatus of claim 3, wherein the output unit includes: a first reference signal adjusting unit adjusting a gradient of the first temperature coefficient signal, and a second reference signal adjusting unit adjusting a gradient of the second temperature coefficient signal.

7. The apparatus of claim 4, wherein the output unit includes: a first reference signal adjusting unit adjusting a gradient of the first temperature coefficient signal, and a second reference signal adjusting unit adjusting a gradient of the second temperature coefficient signal.

8. The apparatus of claim 1, wherein the PCTAT signal generating unit compares the first temperature coefficient signal with the second temperature coefficient, and outputs the smaller.

9. The apparatus of claim 4, wherein the PCTAT signal generating unit compares the first temperature coefficient signal with the second temperature coefficient, and outputs the smaller.

* * * * *